United States Patent
Jean

(10) Patent No.: US 10,871,968 B2
(45) Date of Patent: *Dec. 22, 2020

(54) MANAGED MULTIPLE DIE MEMORY QOS

(71) Applicant: Micron Technology, Inc., Boise, ID (US)

(72) Inventor: Sebastien Andre Jean, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 42 days.

This patent is subject to a terminal disclaimer.

(21) Appl. No.: 16/409,062

(22) Filed: May 10, 2019

(65) Prior Publication Data

US 2019/0265975 A1 Aug. 29, 2019

Related U.S. Application Data

(63) Continuation of application No. 15/692,225, filed on Aug. 31, 2017, now Pat. No. 10,318,301.

(51) Int. Cl.
| | |
|---|---|
| G06F 9/30 | (2018.01) |
| G06F 13/16 | (2006.01) |
| G06F 13/18 | (2006.01) |
| G11C 16/04 | (2006.01) |

(52) U.S. Cl.
CPC ........ *G06F 9/30192* (2013.01); *G06F 9/3004* (2013.01); *G06F 13/1642* (2013.01); *G06F 13/1668* (2013.01); *G06F 13/18* (2013.01); *G11C 16/04* (2013.01)

(58) Field of Classification Search
CPC .................................................. G06F 9/30192
See application file for complete search history.

(56) References Cited

U.S. PATENT DOCUMENTS

| | | |
|---|---|---|
| 8,510,521 B2 | 8/2013 | Biswas et al. |
| 9,229,896 B2 | 1/2016 | Balkan et al. |
| 9,563,369 B2 | 2/2017 | Quach et al. |
| 2003/0081612 A1 | 5/2003 | Goetzinger et al. |

(Continued)

FOREIGN PATENT DOCUMENTS

WO  WO-2019046048 A1  3/2019

OTHER PUBLICATIONS

"International Application Serial No. PCT/US2018/047347, International Search Report dated Jan. 3, 2019", 3 pgs.

(Continued)

*Primary Examiner* — Charlie Sun
(74) *Attorney, Agent, or Firm* — Schwegman Lundberg & Woessner, P.A.

(57) ABSTRACT

Devices and techniques for implementing quality-of-service (QoS) parameters in a managed memory device having a number of memory dies are disclosed herein. A memory controller can receive instructions from a host device, determine an initial priority for each instruction using QoS parameters, and allocate the received instructions to the number of memory dies using the initial priority. The memory controller can maintain separate schedules for each of the number or memory dies, update the initial priority for each instruction with the separate schedules, and maintain each of the separate schedules using the updated priority for each instruction in the respective separate schedule.

25 Claims, 6 Drawing Sheets

(56) References Cited

U.S. PATENT DOCUMENTS

| | | |
|---|---|---|
| 2011/0197038 A1 | 8/2011 | Henriksson et al. |
| 2011/0225583 A1* | 9/2011 | Suh ..................... G06F 9/4843 718/1 |
| 2011/0276973 A1 | 11/2011 | Chung et al. |
| 2012/0072678 A1 | 3/2012 | Biswas et al. |
| 2013/0232495 A1* | 9/2013 | Rossbach ............. G06F 9/5044 718/102 |
| 2014/0181428 A1 | 6/2014 | Hsu et al. |
| 2015/0333994 A1 | 11/2015 | Gell et al. |
| 2015/0363331 A1 | 12/2015 | Yamamoto et al. |
| 2019/0065204 A1 | 2/2019 | Jean |

OTHER PUBLICATIONS

"International Application Serial No. PCT/US2018/047347, Written Opinion dated Jan. 3, 2019", 4 pgs.

\* cited by examiner

MANAGED MULTIPLE DIE MEMORY QOS

PRIORITY APPLICATION

This application is a continuation of U.S. application Ser. No. 15/692,225, filed Aug. 31, 2017, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each memory cell in a memory array can be programmed individually or collectively to one or a number of programmed states. For example, a single-level cell (SLC) can represent one of two programmed states (e.g., 1 or 0), representing one bit of data. In other examples, memory cells can represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive instructions (e.g., commands) from a host in association with memory operations, such as read or write operations to transfer data (e.g., user data and associated integrity data, such as error data and address data, etc.) between the memory devices and the host, or erase operations to erase data from the memory devices.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
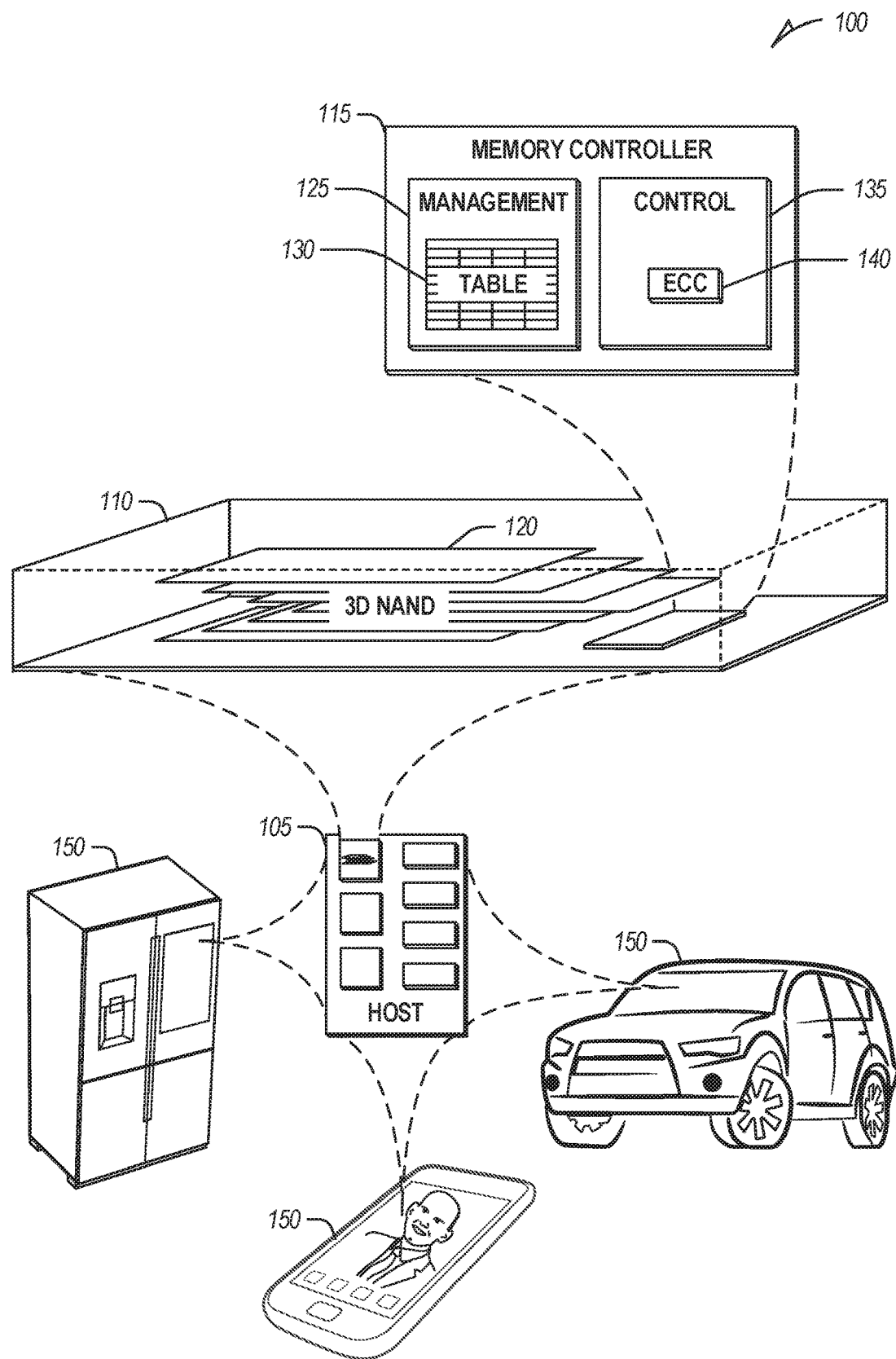
FIG. 1 illustrates an example of an environment including a memory device.

Processors, such as CPUs or other main processors of electronic devices, often implement parameters to affect user quality of service (QoS), and provide instructions to a memory device in accordance with such implemented QoS parameters. In certain examples, QoS parameters can prioritize certain actions, instructions, operations, or applications. As processor and memory device speeds and complexities continue to increase, communication between the processor and the memory device can be a limiting factor affecting device operation.

The present inventor has recognized, among other things, that a managed memory device, including a memory controller and a number of memory dies (more than one, such as 8, 16, etc.), can directly implement QoS parameters in addition to, or separate from, the QoS parameters of the processor of the host device. Accordingly, QoS parameters may be implemented in a managed memory device to optimize device operation, to increase communication bandwidth between the processor and the managed memory device (or bandwidth in the processor itself) for higher-priority traffic, instructions, or operations, such as those affecting user experience or QoS (e.g., smooth and responsive device operation during resource intensive operations, such as streaming high-definition (HD) video, augmented virtual reality, etc.).

Mobile electronic device usage can be characterized by short, often intense periods of user activity followed by long periods of user inactivity (e.g., 5% active, 95% inactive). QoS parameters implemented by a host processor limit the bandwidth of the communication channel, as well as processing power of the host processor, reducing bandwidth for high-priority, high-bandwidth operations, such as HD (e.g., 4K) streaming video or video capture, augmented or virtual reality applications, high-speed image capture, gallery creation, etc. As the number of memory dies or logical units in the managed memory device continues to increase (e.g., from 8, to 16, etc.), with each memory die including die circuitry configured to traditional operations (e.g., read, program, erase) or advanced logic functions (e.g., calculations, encryption/decryption, etc.), polling each die or logical unit for availability and status using the host processor can become more burdensome and performance limiting. Accordingly, to increase system performance, QoS parameters can be implemented on the managed memory device itself, including at the memory controller, and, in certain examples, at the individual die or logical unit.

During periods of user activity, high-priority traffic, instructions, or operations, such those affecting user experience or QoS, may be prioritized over lower-priority traffic, instructions, or operations. For example, reads, writes or operations affecting device responsiveness, such as responses to gestures (e.g., scrolling, etc.) or instructions (e.g., commands), loading of applications from memory, producing galleries of stored images, etc., may be prioritized over writes of user data. In other examples, one or more of a series of similar actions (e.g., high-speed image capture) may be sacrificed (e.g., a captured image may be omitted from memory) to retain device responsiveness to user actions. It is important to view priority in terms of system-level resources. Whereas, at die level, instructions can be considered independent, at a system level, depending on how the information will be used, or which instructions affect other instructions, certain instructions should be performed together, such as to consume system resources in the order in which they are consumed, for example, to avoid resource deadlock. Accordingly, priority can be determined, not only on the priority of the individual instruction, but of the individual instruction in relation to other pending, interrupted, or completed instructions. For example, if a first instruction is related to a second instruction, and the second instruction is complete (e.g., cached), but the system is waiting for the first instruction to be complete before proceeding, the priority of the first instruction can be increased in relation to other instructions.

Low-priority traffic, instructions, or operations (including, in certain examples, garbage collection, error correction, application management, memory management, specific writes, network updates, notifications, etc.) may be queued or delayed during periods of user activity (e.g., 5% active) in favor of higher-priority traffic, instructions, or operations. In an example, the low-priority traffic, instructions, or operations can be cached, or performed during periods of user inactivity (e.g., 95% inactive), during periods of decreased user activity, or using an available memory die during periods of user activity or inactivity. In certain examples, high-priority traffic can include operations not easily delayed (e.g., not able to be cached, or such that delay would adversely affect user QoS, etc.), such as HD streaming video or video capture video, augmented or virtual reality applications, high-speed image capture, etc.

To be immediately responsive to sudden user activity, low-priority traffic or operations may be interruptible, such as using a software or hardware interrupt during an operation or after a cycle of an operation requiring multiple cycles. In other examples, the priority of traffic, instructions, or operations can change with time (e.g., linearly, exponentially, non-linearly, etc.), such as to avoid time-out or failure, etc. In certain examples, all traffic, instructions, or operations may be interruptible. In an example, the memory controller or die logic of a respective die of the managed memory device can interrupt or queue operation of a low-priority instruction or operation in favor of higher-priority instruction or operation. Such QoS parameters can be stored, managed, or implemented on the memory controller or the die logic, such as using a schedule or a list stored in a register, cache, or otherwise in the memory device. In certain examples, the QoS parameters can be received from the host processor, or otherwise programmed onto the managed memory device.

In an example, the memory controller can provide instructions to a respective die (e.g., including providing redundant operations to multiple die, or breaking large operations into a number of smaller operations to be performed across one or more die, etc.). In other examples, die logic from each respective die can interrupt low-priority operations in favor of higher-priority operations. In certain examples, high-priority operations can be interrupted to avoid time-out of pending, low-priority operations, for example, if timeout of such low-priority operations would affect user experience (e.g., to avoid application failure or data loss, or if such time-out would require the user to re-do an operation, etc.). If a die performs a redundant operation, the memory controller can reallocate redundant memory cells, pages, blocks, etc. storing redundant data at next garbage collection or period of user inactivity.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). Each memory die can include respective die logic, configured to receive instructions from, or provide information to, the memory controller 115. In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 500 of FIG. 5.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

In an example, the memory controller 115 can receive instructions from the host device 105, such as from a user, application, process, etc., through a processor of the host device 105 or one or more other component (e.g., GPU, telemetry circuit, sensor, etc.). The host device 105 can be configured to organize instructions or operations depending on desired QoS parameters. In certain examples, the host device 105 can poll the memory device 110, or otherwise manage the status or operation of the memory device 110, to manage operation of the memory device 110 (e.g., control the order in which instructions or operations are implemented) to affect user experience or QoS. In other examples, the host device 105 may provide instructions to the memory device 110, and the memory controller 115 can manage the instructions or operation to affect user experience or QoS, or to implement QoS parameters.

The memory array 120 can include a number of individual memory dies, each including respective die logic. The memory controller 115 can receive instructions from the host device 105, organize the received instructions according to QoS parameters, such as by receiving or assigning a priority for each instruction, and provide the instructions to the individual memory die to be completed according to their priority. As the number of memory dies increases, however, or as the number or type of received instructions increases, management of the list can become complex. The present inventor has recognized, among other things, that the memory controller 115 can be configured to maintain a separate schedule for each of the individual memory dies (e.g., in a register, list, table, specified portion of memory, etc.).

In an example, the memory controller 115 can receive or assign an initial priority for each instruction based on QoS parameters, and allocate each of the received instructions to one or more separate schedules of the individual memory dies (e.g., one or more of the number of individual memory dies) according to the received or assigned initial priority. For example, certain memory dies can be reserved for certain priority instructions (e.g., high-priority instructions, low-priority instructions, etc.) or certain known tasks (e.g., HD streaming or capture, block-level writes, etc.). With multiple memory dies, it can be advantageous to allocate memory dies different priority tasks or instructions, to ensure smooth operation and avoid timeout of low-priority instructions, while still maintaining some responsiveness. Further, in certain examples, it can be advantageous to provide redundant instructions to more than one memory die, or to break tasks or instructions into pieces to be performed by more than one memory die.

In an example, after allocating a received instruction to one or more separate schedules for one or more respective individual memory dies based on the initial priority, the memory controller 115 can update the initial priority for one or more of the allocated instructions in one or more of the separate schedules. In certain examples, the initial priority of each instruction can be updated. In other examples, only instructions having a specific initial priority can be updated, or an initial priority can be updated after a specified time. In an example, a time of the instruction, such as the time the instruction has been scheduled, but not yet completed (e.g., interrupted, pending, etc.), can affect the updated priority. The priority of a low-initial-priority instruction can be increased linearly, in a step-wise fashion based on total time, exponentially, or variably, depending on the type of instruction or one or more other factors, such as time-out of the specific instruction, whether the instruction has been interrupted, whether redundant instructions have been allocated to one or more other memory die, etc. The memory controller 115 can update the order in the separate schedules, and provide instructions to the respective memory die using the maintained order. In other examples, the memory controller can update the priority (e.g., a value of the priority) of the instructions in an unordered list at the time the memory die is available to perform another instruction, and provide the highest priority instruction from the list.

In other examples, the memory controller 115 can be configured to receive instructions from the host device 105, receive or assign an initial priority for each instruction based on QoS parameters, and allocate each of the received instructions to the individual memory dies using the initial priority. In an example, the allocated instructions can be maintained at the respective die logic, such as by implementing one or more QoS parameter (e.g., to update the initial priority) at the respective die logic. For example, the die logic can receive allocated instructions, and maintain a schedule of instructions based on the initial priority for each instruction.

In an example, the instructions can include low-priority instructions and high-priority instructions. In other examples, instructions may include one or more other intermediate priorities. In an example, low-priority instructions can be interruptible. In other examples, all instructions can be interruptible (e.g., except the highest-priority instruction) by an instruction having a higher priority. In certain examples, instructions may be interruptible for a time, for example, until the instruction is at risk of timing out. In an example, the priority of an instruction at risk of timing out can be increased to a higher-priority, or a higher-priority instruction may be interrupted by a lower-priority instruction to avoid time-out of the lower-priority instruction. In certain examples, the priority of specific instructions may depend on their effect to user experience or user-perceived QoS.

In an example, an instruction can be one of a set of inter-related or dependent instructions, such that the priority of one instruction can affect the priority of other instructions, such as to avoid resource deadlock. For example, if the system requires separate reads from separate dies, but must receive all reads in order to use the requested information, the priority of one instruction can be related to the priority of all, such as to avoid a scenario where the memory controller 115 must cache received information for extended periods of time as one or more memory die are occupied with other higher-priority operations. In this example, an individual memory die may refrain from performing an instruction, even if the respective schedule for the memory die includes only that instruction, until other related instructions, or instructions from the set of instructions including that instruction, are ready to be performed by one or more other memory die. In other examples, the memory controller 115 can adjust the priority of the related instructions within the separate schedules, not to have the same priority, but to be performed at the same time among the number of memory dies.

Figure 2:
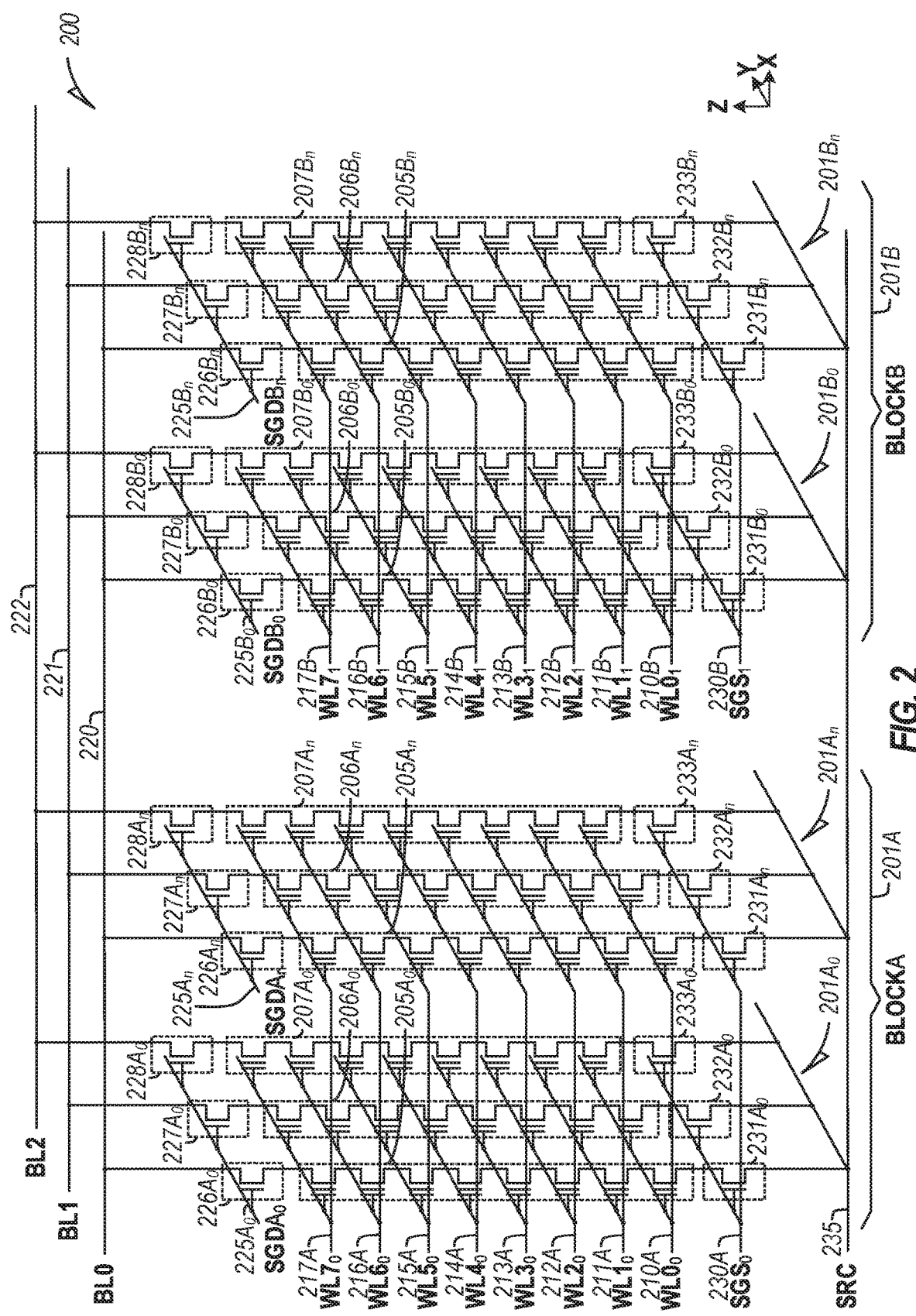
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233_B$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
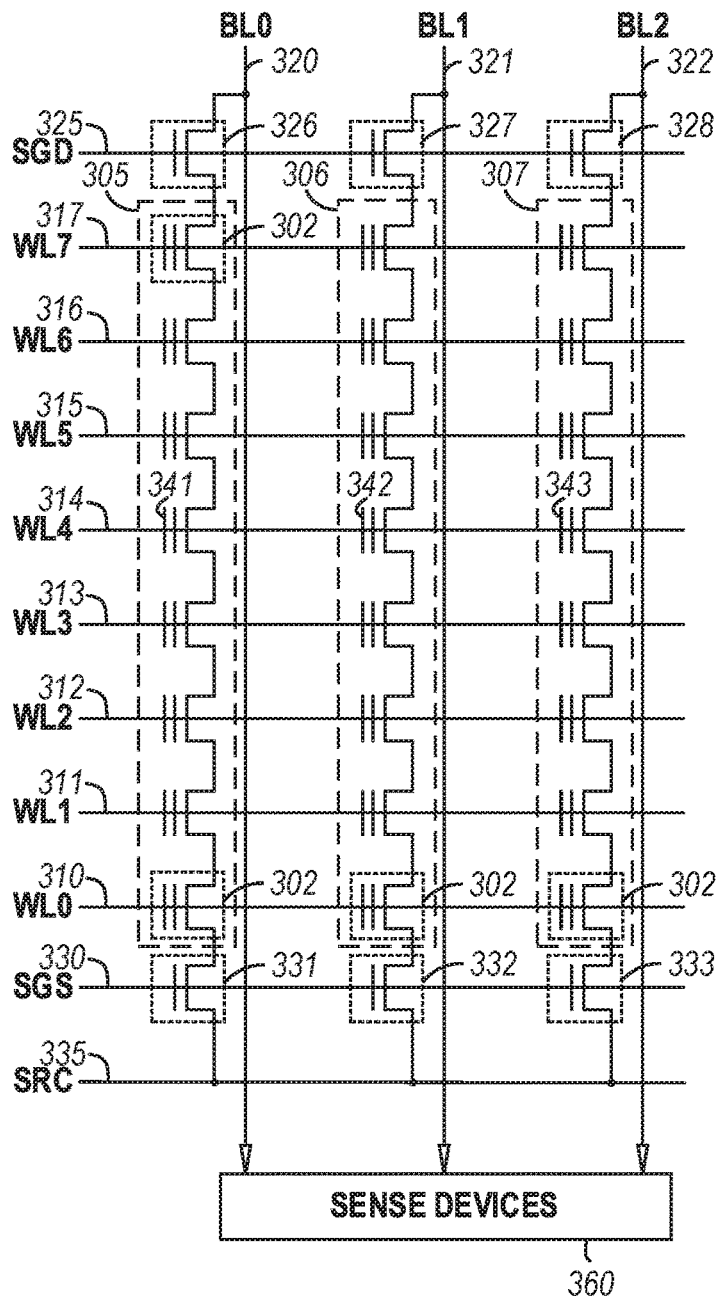

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
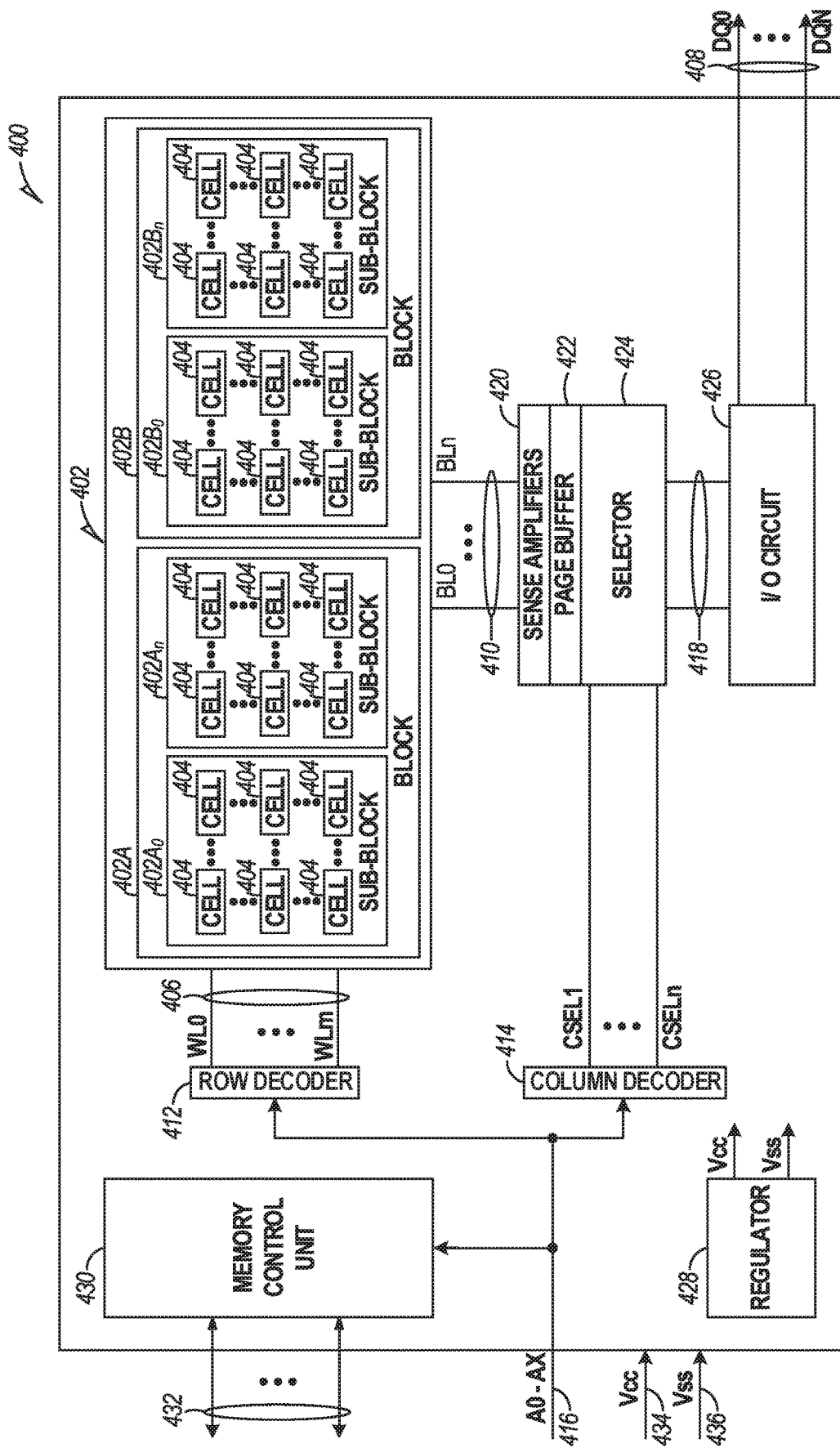
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
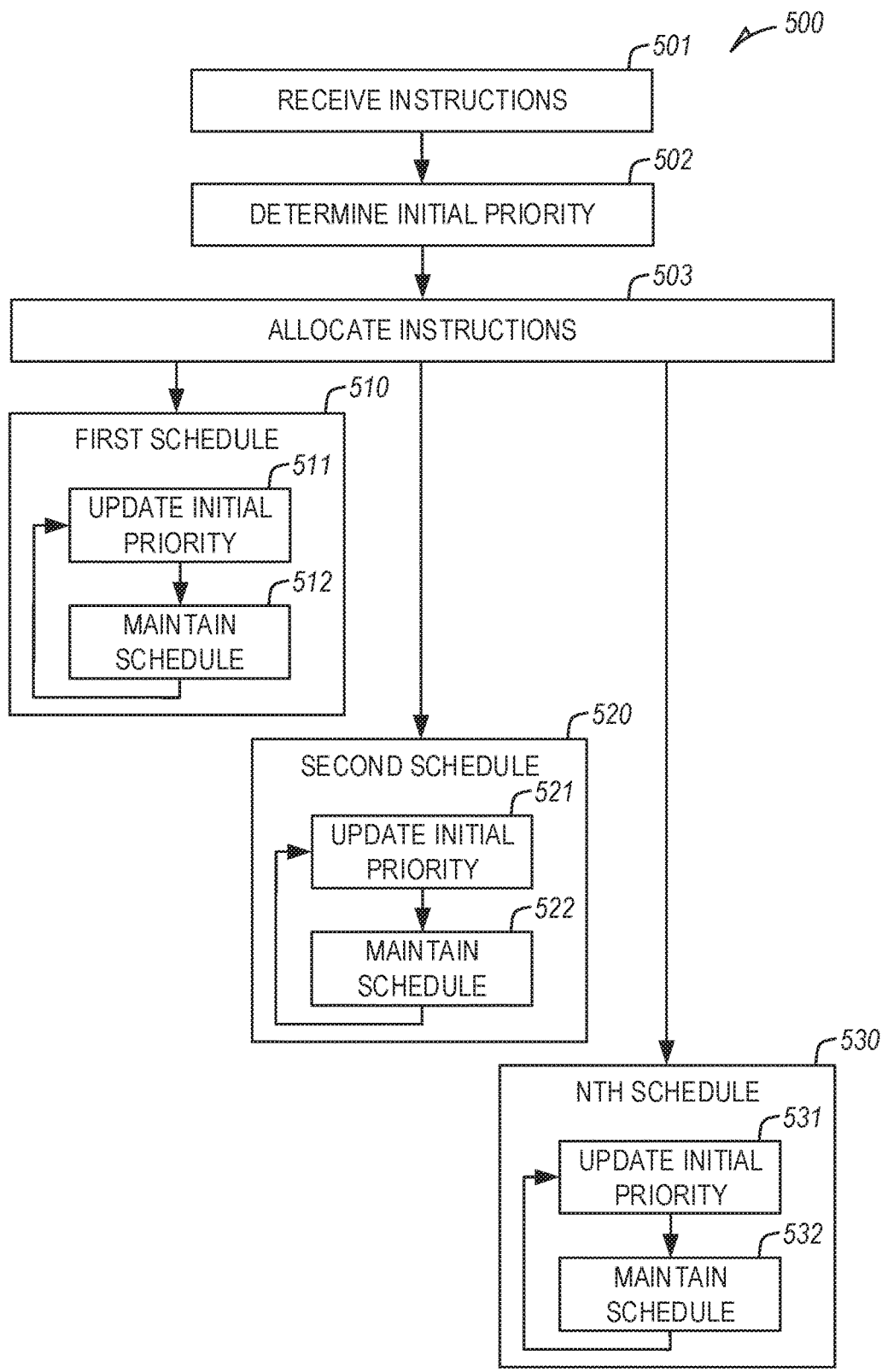
FIG. 5 illustrates an example method to maintain separate schedules for each of a number of memory dies in a memory array of a memory device using a memory controller.

FIG. 5 illustrates an example method 500 to maintain separate schedules for each of a number of memory dies in a memory array of a memory device using a memory controller. At 501, one or more instructions can be received, such as by the memory controller of the memory device. In an example, the one or more instructions can be received from a host device. In an example, the host device can include a processor of an electronic device including the memory device. In other examples, the host device can include one or more other devices.

At 502, an initial priority of one or more of the received instructions can be determined, such as by the memory controller of the memory device, using one or more quality-of-service (QoS) parameters. In an example, the memory controller can determine an initial priority for each of the received instructions, in certain examples, using priority information received from the host device.

At 503, the received instructions can be allocated to the number of memory dies, such as using the determined initial priorities of the one or more instructions. In an example, the number of memory dies can include a first memory die, a second memory die, and an nth memory die. In certain examples, the number of memory dies can include 8 memory dies, 16 memory dies, or one or more other number of memory dies.

In an example, the instructions can be allocated to separate schedules for each of the number of memory dies, maintained by the memory controller. In other examples, the separate schedules can be maintained by die logic of the number of memory dies, and the die logic of each of the number of memory dies can implement parameters to affect user QoS. In an example, the schedules can include a first schedule 510, a second schedule 520, and an nth schedule 530, such as for respective first, second, and third memory dies, the schedules maintained on the memory controller or the die logic of the respective memory dies.

At 511, the initial priority of one or more instructions of the first schedule 510 can be updated, such as using the memory controller or the die logic of the respective memory die. In certain examples, the memory controller, or the die logic, can update the initial priority for one or more of the received instructions in the respective schedule for each of the number of memory dies, for example, using the initial priority and a time of the instruction, or using a status of one or more related instructions. At 512, the first schedule can be maintained using the updated priority. In an example, the schedule can include an ordered list of instructions to be serviced by the respective memory die. When the initial priority is updated, the list can be reordered using the updated priority. In other examples, the initial priority can be updated without reordering the respective schedule.

At 521, the initial priority of one or more instructions of the second schedule 520 can be updated. At 522, the second schedule can be maintained using the updated priority. At 531, the initial priority of one or more instructions of the nth schedule 530 can be updated. At 532, the nth schedule can be maintained using the updated priority.

Figure 6:
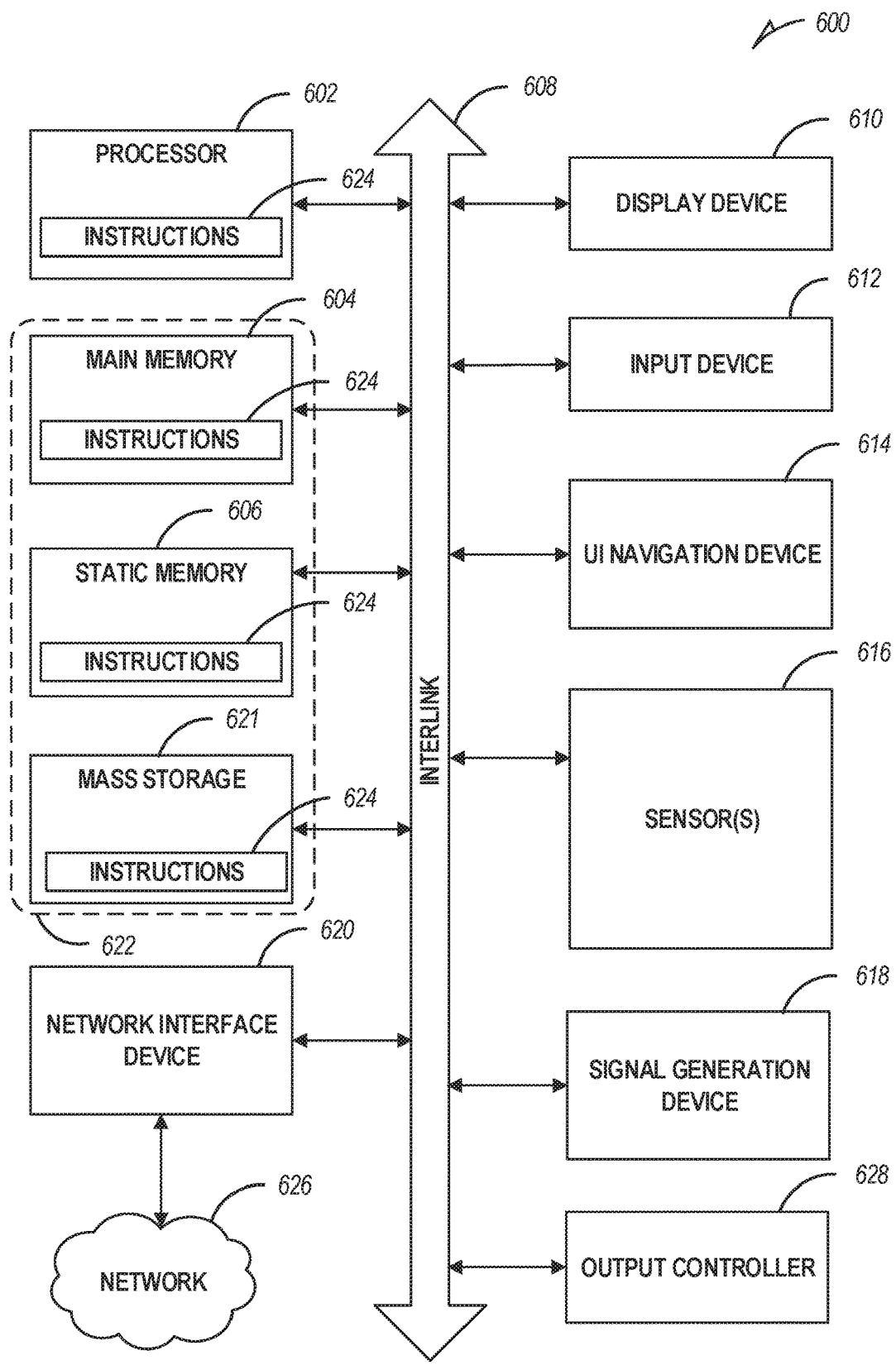
FIG. 6 is a block diagram illustrating an example of a machine upon which one or more embodiments may be implemented.

FIG. 6 illustrates a block diagram of an example machine 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 600 (e.g., the host device 105, the memory device 110, etc.) may include a hardware processor 602 (e.g., a central processing unit (CPU), a graphics processing unit (GPU), a hardware processor core, or any combination thereof, such as the memory controller 115, etc.), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 616, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 may constitute the machine readable medium 622.

While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, can be accessed by the memory 604 for use by the processor 602. The memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 621 can be allocated to supplement the memory 604; however, because the storage 621 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 621 for virtual memory can greatly reduce the usable lifespan of the storage device 621.

In contrast to virtual memory, virtual memory compression (e.g., the Linux® kernel feature "ZRAM") uses part of the memory as compressed block storage to avoid paging to the storage device 621. Paging takes place in the compressed block until it is necessary to write such data to the storage device 621. Virtual memory compression increases the usable size of memory 604, while reducing wear on the storage device 621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Example 1 is a managed memory device, comprising: a memory controller; and a memory array, including a number of memory dies, wherein the memory controller is configured to receive instructions from a host device, to determine an initial priority for each instruction using quality-of-service (QoS) parameters, and to allocate the received instructions to the number of memory dies using the initial priority, wherein the memory controller is configured to maintain separate schedules for each of the number of memory dies, to update the initial priority for a first instruction in a separate schedule for a respective memory die using the initial priority and a time of the instruction, and to maintain the separate schedule using the updated priority for the first instruction in the separate schedule.

In Example 2, the subject matter of Example 1 optionally includes wherein the memory controller is configured to update the initial priorities for each instruction in the separate schedules using the initial priority and time of each instruction, and to maintain the separate schedules using the updated priorities.

In Example 3, the subject matter of any one or more of Examples 1-2 optionally include wherein the memory controller is configured to receive the QoS parameters from the host device.

In Example 4, the subject matter of any one or more of Examples 1-3 optionally include wherein the memory controller is configured to receive priority information for a respective instruction from the host device, and to determine the initial priority using the received priority information and the QoS parameters.

In Example 5, the subject matter of any one or more of Examples 1-4 optionally include wherein the memory controller is configured to update the initial priority for each instruction as a function of the initial priority and a remaining time before time-out of the respective instruction.

In Example 6, the subject matter of Example 5 optionally includes wherein the function of the remaining time before time-out of the respective instruction includes a non-linear function of the remaining time before time-out of the respective instruction.

In Example 7, the subject matter of any one or more of Examples 1-6 optionally include wherein the memory controller is configured to update the initial priority for the first instruction as a function of the initial priority of the first instruction and a status of a second instruction related to the first instruction.

In Example 8, the subject matter of any one or more of Examples 1-7 optionally include wherein the memory controller is configured to: generate a memory address and command for each instruction; assign the instruction to at least one of the number of memory dies depending on the memory address and command, or existing instructions allocated to the number of memory dies; update the initial priority for each instruction as a function of the initial priority and the time of the instruction; and order the allocated instructions in each of the separate schedules using the updated priority for each instruction, wherein each memory die is configured to service instructions in order as maintained in the separate schedules for each memory die.

In Example 9, the subject matter of any one or more of Examples 1-8 optionally include wherein the memory controller is configured to determine a higher initial priority for read instruction from a specific memory die than to a write instruction for any of the number of memory dies.

In Example 10, the subject matter of any one or more of Examples 1-9 optionally include wherein, if the memory controller determines an instruction as low initial priority to any one of the number of memory dies, the memory controller is configured to allocate the low initial priority instruction to redundant memory dies.

In Example 11, the subject matter of any one or more of Examples 1-10 optionally include wherein each instruction is interruptible by another instruction having a higher determined priority.

Example 12 is a method for managing a memory device, the method comprising a number of operations performed by a memory controller of the memory device, the memory device including a memory array having a number of memory dies, each memory die having groups of multiple blocks of memory cells, the operations comprising: receiving instructions from a host device; determining an initial priority for each instruction using quality-of-service (QoS) parameters; allocating the received instructions to the number of memory dies using the initial priority; maintaining separate schedules for each of the number of memory dies, including: updating the initial priority for a first instruction in a first schedule for a first memory die of the number of memory dies using the initial priority and a time of the instruction; and maintaining the first schedule using the updated priority for the instruction in the first schedule.

In Example 13, the subject matter of Example 12 optionally includes wherein maintaining the separate schedules for each of the memory dies includes updating the initial priorities for each instruction in the separate schedules using the initial priority and time of each instruction, and maintaining the separate schedules using the updated priorities.

In Example 14, the subject matter of any one or more of Examples 12-13 optionally include wherein maintaining separate schedules for each of the number of memory dies includes: updating the initial priority for each instruction as a function of the initial priority and a remaining time before time-out of the respective instruction.

In Example 15, the subject matter of any one or more of Examples 12-14 optionally include wherein maintaining separate schedules for each of the number of memory dies includes: updating the initial priority for the first instruction as a function of the initial priority of the first instruction and a status of a second instruction related to the first instruction.

In Example 16, the subject matter of any one or more of Examples 12-15 optionally include the operations comprising: generating a memory address and command for each instruction; assigning the instruction to at least one of the number of memory dies depending on the memory address and command, or existing instructions allocated to the number of memory dies; updating the initial priority for each instruction as a function of the initial priority and the time of the instruction; ordering the allocated instructions in each of the separate schedules using the updated priority for each instruction; and servicing instructions in order as maintained in the separate schedules for each memory die.

In Example 17, the subject matter of any one or more of Examples 12-16 optionally include wherein each instruction is interruptible by another instruction having a higher determined priority.

Example 18 is a device readable storage medium that provides instructions that, when executed by a memory controller of a memory device including a memory array having a number of memory dies, cause the memory controller to perform operations comprising: receive instructions from a host device; determine an initial priority for each instruction using quality-of-service (QoS) parameters; allocate the received instructions to the number of memory dies using the initial priority; maintain separate schedules for each of the number of memory dies, including: update the initial priority for a first instruction in a first schedule for a first memory die of the number of memory dies using the initial priority and a time of the instruction; and maintain the first schedule using the updated priority for the instruction in the first schedule.

In Example 19, the subject matter of Example 18 optionally includes wherein the operation to maintain the separate schedules for each of the memory dies includes to update the initial priorities for each instruction in the separate schedules using the initial priority and time of each instruction, and to maintain the separate schedules using the updated priorities.

In Example 20, the subject matter of any one or more of Examples 18-19 optionally include wherein the operation to maintain the separate schedules for each of the number of memory dies includes to update the initial priority for each instruction as a function of the initial priority and a remaining time before time-out of the respective instruction.

In Example 21, the subject matter of any one or more of Examples 18-20 optionally include wherein the operation to maintain the separate schedules for each of the number of memory dies includes to update the initial priority for the first instruction as a function of the initial priority of the first instruction and a status of a second instruction related to the first instruction.

In Example 22, the subject matter of any one or more of Examples 18-21 optionally include the operations comprising: generate a memory address and command for each instruction; assign the instruction to at least one of the number of memory dies depending on the memory address and command, or existing instructions allocated to the number of memory dies; update the initial priority for each instruction as a function of the initial priority and the time of the instruction; order the allocated instructions in each of the separate schedules using the updated priority for each instruction; and service instructions in order as maintained in the separate schedules for each memory die.

In Example 23, the subject matter of any one or more of Examples 18-22 optionally include wherein each instruction is interruptible by another instruction having a higher determined priority.

Example 24 is a device readable storage medium, that provides instructions that, when executed by a controller of a memory device, optimizes voltage read level calibration in the memory device, wherein the instructions cause the controller to perform operations according to any of the techniques of Examples 1-23.

Example 25 is an apparatus comprising respective means for performing any of the methods or techniques of Examples 1-23.

Example 26 is a system, apparatus, or device to perform the operations of any of Examples 1-23.

Example 27 is a tangible machine readable medium embodying instructions to perform or implement the operations of any of Examples 1-23.

Example 28 is a method to perform the operations of any of Examples 1-23.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A managed memory device, comprising:
a memory controller; and
a memory array comprising multiple memory dies,
wherein the memory controller is configured to receive instructions from a host device, to determine a first priority for a received instruction using a quality-of-service (QoS) parameter, and to allocate the received instruction to a first memory die of the multiple memory dies, and
wherein the first memory die is configured to receive the first instruction from the memory controller and maintain a schedule of received instructions, including the first instruction, and
wherein the first memory die is configured to determine a second priority for the first instruction using the first priority and a time of the first instruction, and to update the schedule using the second priority.

2. The managed memory device of claim 1, wherein the first memory die comprises die logic configured to maintain the schedule for the first memory die, to determine the second priority for the first instruction, and to update the schedule for the first memory die using the second priority.

3. The managed memory device of claim 1, wherein the first memory die is configured to receive multiple instructions from the memory controller, to maintain the schedule of the first memory die, the schedule comprising an order of the multiple instructions, the multiple instructions comprising the first instruction.

4. The managed memory device of claim 1, wherein the memory controller is configured to receive priority information for a respective instruction from the host device, and to determine the first priority using the received priority information and the QoS parameter.

5. The managed memory device of claim 1, wherein the time of the first instruction is a function of a remaining time before time-out of the first instruction.

6. The managed memory device of claim 1, wherein the first memory die is configured to determine the second priority for the first instruction using the first priority and a status of a second instruction related to the first instruction.

7. The managed memory device of claim 1, wherein, to maintain the schedule of received instructions, the first memory die is configured to order the received instructions in the schedule using determined priorities of the received instructions.

8. The managed memory device of claim 1, wherein each instruction maintained in the schedule is interruptible by another instruction having a higher determined priority.

9. The managed memory device of claim 1, wherein the QoS parameter comprises a parameter affecting perceived user-experience, including responsiveness to user activity.

10. The managed memory device of claim 1, wherein the multiple memory dies comprise different memory dies having different priorities, and
wherein the memory controller is configured to determine first priorities for the received instructions and to allocate the received instructions to the multiple memory dies according to the determined first priories of the received instructions and to the priorities of the multiple memory dies.

11. A method, comprising:
receiving, using a memory controller of a managed memory device, an instruction from a host device;
determining, using the memory controller, a first priority for a received instruction using a quality-of-service (QoS) parameter;
allocating, using the memory controller, the received instruction to a first memory die of multiple memory dies of the managed memory device;
receiving, using a first memory die of the multiple memory dies, a first instruction from the memory controller;
maintaining, using the first memory die, a schedule of received instructions, including the first instruction;
determining, using the first memory die, a second priority for the first instruction using the first priority and a time of the first instruction; and
updating, using the first memory die, the schedule using the second priority.

12. The method of claim 11, wherein the first memory die comprises die logic, and
wherein maintaining the schedule for the first memory die, determining the second priority for the first instruction, and updating the schedule using the second priority comprises using the die logic of the first memory die.

13. The method of claim 11, comprising:
receiving, using the first memory die, multiple instructions from the memory controller,
wherein maintaining the schedule of received instructions comprises maintaining an order of the received instructions, and
wherein updating the schedule includes updating the order of the instructions in the schedule using the second priority.

14. The method of claim 11, comprising:
receiving priority information for a respective instruction from the host device,
wherein determining the first priority comprises using the received priority information and the QoS parameter.

15. The method of claim 11, wherein the time of the first instruction is a function of a remaining time before time-out of the first instruction.

16. The method of claim 11, wherein determining the second priority for the first instruction comprises using the first priority and a status of a second instruction related to the first instruction.

17. The method of claim 11, wherein maintaining the schedule of received instructions comprises ordering the received instructions in the schedule.

18. The method of claim 11, wherein each instruction maintained in the schedule is interruptible by another instruction having a higher determined priority.

19. The method of claim 11, wherein the QoS parameter comprises a parameter affecting perceived user-experience, including responsiveness to user activity.

20. The method of claim 11, comprising:
determining, using the memory controller, first priorities for the received instructions from the host device,
wherein allocating the received instructions comprises allocating the received instructions to the multiple memory dies, the multiple memory dies having different priorities, according to the determined first priories of the received instructions and to the priorities of the multiple memory dies.

21. At least one non-transitory device-readable storage medium comprising instructions that, when executed by die logic of a first memory die of a managed memory device comprising a memory controller and multiple memory dies, cause the die logic to perform operations comprising:
receiving a first instruction from the memory controller, the first instruction having a first priority;
maintaining a schedule of received instructions, including the first instruction;
determining a second priority for the first instruction using the first priority and a time of the first instruction; and
updating the schedule using the second priority.

22. The at least one non-transitory device-readable storage medium of claim 21, wherein first priority is determined for the first instruction by the memory controller according to a quality-of-service (QoS) parameter.

23. The at least one non-transitory device-readable storage medium of claim 21, wherein the operations comprise:
receiving multiple instructions from the memory controller,
wherein maintaining the schedule of received instructions comprises maintaining an order of the received instructions, and
wherein updating the schedule includes updating the order of the instructions in the schedule using the second priority.

24. The at least one non-transitory device-readable storage medium of claim 21, wherein the time of the first instruction is a function of a remaining time before time-out of the first instruction.

25. The at least one non-transitory device-readable storage medium of claim 21, wherein determining the second priority for the first instruction comprises using the first priority and a status of a second instruction related to the first instruction.

* * * * *